(12) United States Patent
Hordon et al.

(10) Patent No.: US 9,934,933 B1
(45) Date of Patent: Apr. 3, 2018

(54) EXTRACTOR ELECTRODE FOR ELECTRON SOURCE

(71) Applicant: KLA-Tencor Corporation, Milpitas, CA (US)

(72) Inventors: Laurence S. Hordon, Mountain View, CA (US); Nikolai Chubun, San Jose, CA (US); Luca Grella, Gilroy, CA (US); Xinrong Jiang, Palo Alto, CA (US); Daniel Bui, Castro Valley, CA (US); Kevin Cummings, Milpitas, CA (US); Christopher Sears, San Jose, CA (US); Oscar G. Florendo, Hillister, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/593,900

(22) Filed: May 12, 2017

Related U.S. Application Data

(60) Provisional application No. 62/447,917, filed on Jan. 19, 2017.

(51) Int. Cl.
| | |
|---|---|
| *H01J 37/28* | (2006.01) |
| *H01J 37/00* | (2006.01) |
| *H01J 37/073* | (2006.01) |
| *H01J 37/065* | (2006.01) |
| *H01J 37/14* | (2006.01) |

(52) U.S. Cl.
CPC .......... *H01J 37/065* (2013.01); *H01J 37/073* (2013.01); *H01J 37/14* (2013.01); *H01J 37/28* (2013.01); *H01J 2237/06316* (2013.01); *H01J 2237/06375* (2013.01)

(58) Field of Classification Search
CPC ........ H01J 37/06; H01J 37/061; H01J 37/065; H01J 37/073; H01J 37/28; H01J 2237/06316; H01J 2237/06375
See application file for complete search history.

(56) References Cited

U.S. PATENT DOCUMENTS

| | | | | |
|---|---|---|---|---|
| 3,585,546 A | * | 6/1971 | Yanaka ................... | H01F 7/202 250/396 ML |
| 5,199,917 A | * | 4/1993 | MacDonald ........... | B82Y 10/00 313/336 |
| 5,661,307 A | * | 8/1997 | Tanaka ................... | B82Y 10/00 250/398 |
| 5,828,064 A | * | 10/1998 | Knowles ............... | H01J 37/244 250/310 |

(Continued)

OTHER PUBLICATIONS http://nanoweb.mit.edu/annual-report00/23.html—Field Emitter Array Flat Panel Displays for Head-Mounted Applications—Nov. 17, 2004.*

*Primary Examiner* — Jason McCormack
*Assistant Examiner* — Sean Luck
(74) *Attorney, Agent, or Firm* — Hodgson Russ LLP

(57) ABSTRACT

Extractors and extractor systems minimize the generation of secondary electrons which interact with and degrade the primary electron beam. This can improve the performance of an electron beam system, such as a scanning electron microscope. The extractor may include a frustoconical aperture that widens as distance from the source of the electron beam increases. The entrance into the frustoconical aperture also can include a curved edge.

20 Claims, 6 Drawing Sheets

(56) References Cited

U.S. PATENT DOCUMENTS

| | | | |
|---|---|---|---|
| 6,468,386 B1 * | 10/2002 | Jeffryes | C23C 16/45565 |
| | | | 118/723 E |
| 2001/0040215 A1 * | 11/2001 | Ahmed | B82Y 15/00 |
| | | | 250/307 |
| 2005/0150601 A1 * | 7/2005 | Srivastava | H01J 37/32357 |
| | | | 156/345.33 |
| 2016/0064260 A1 * | 3/2016 | Berry, III | H01L 21/67069 |
| | | | 438/712 |

* cited by examiner

EXTRACTOR ELECTRODE FOR ELECTRON SOURCE

CROSS-REFERENCE TO RELATED APPLICATIONS

This application claims priority to the provisional patent application filed Jan. 19, 2017 and assigned U.S. App. No. 62/447,917, the disclosure of which is hereby incorporated by reference.

FIELD OF THE DISCLOSURE

This disclosure relates to electrodes for an electron source.

BACKGROUND OF THE DISCLOSURE

In electron microscopy devices, such as a scanning electron microscope (SEM), an electron beam is sharply focused onto a specimen like a semiconductor wafer. A desired region on the specimen is scanned with the beam. The electron beam irradiation of the specimen produces secondary electrons, which are detected. The resulting signal can be displayed as an image.

An electron optical column is used in electron microscopy. Conventional electron optical columns for electron microscopy typically include an electron source with an electron emitter, such as in a Schottky emission gun or a field emission gun, for producing an electron beam. The electron beam may be used to produce a scanning probe or illuminate a sample or an aperture using a series of electron beam lenses, which may be magnetic or electrostatic. An electron optical column also typically includes an electrostatic pre-accelerator lens that focuses the electron beam and a series of lenses that refocuses and images the source aperture or sample onto the target.

An electron source with an electron emitter, such as in a Schottky emission gun or field emission gun, typically includes an electrode adjacent to the emitter, called an extractor electrode or extractor. The extractor may be configured to generate an electrostatic field at the emitter thereby causing electron emission and acceleration from the emitter into the rest of the electron source and eventually the electron optical column.

In previous extractor designs, the extractor bore sidewalls presented a large surface area to the primary electron beam. Such a large surface area generated a large number of secondary electrons. Secondary electrons interact strongly with the primary electron beam, preventing the beam from achieving a small spot size further down in the electron optical column.

A larger spot size can have negative impact to electron beam systems. This may be especially true if an electron source uses a magnetic lens for focusing the primary beam. The secondary electrons move more slowly than the primary electrons, and the magnetic field from the lens tends to trap them in the vicinity of the primary electron beam for a relatively long time.

An extractor with rounded edges was previously tested. The electron source, in one such case, used an electrostatic lens rather than magnetic lens. However, the manufacturing method produced a radius of curvature at the extractor upper surface of about 100 μm. This is in excess of a value that can effectively minimize the generation of secondary electrons.

Therefore, what is needed is an improved extractor that reduces secondary electron generation.

BRIEF SUMMARY OF THE DISCLOSURE

In a first embodiment, an apparatus is provided. The apparatus comprises an extractor. The extractor has a first surface and a second surface opposite the first surface. The extractor has a sidewall that defines a frustoconical aperture between the first surface and the second surface. The frustoconical aperture widens from the first surface to the second surface. The sidewall of the frustoconical aperture meets the first surface at a curved edge. The curved edge has a radius from 5 μm to 50 μm.

The apparatus may further include an emitter. The extractor is positioned downstream of the emitter with respect to a direction of an electron beam. The extractor may be configured to generate an electrostatic field at the emitter thereby causing electron emission and acceleration.

The aperture may be central to the first surface of the extractor.

The sidewall may meet the second surface at an angled edge.

The sidewall may be angled relative to a center of the frustoconical aperture from 5° to 75°.

The frustoconical aperture may have a diameter from 100 μm to 500 μm.

The frustoconical aperture may have a depth from 0.3 mm to 2.0 mm.

The extractor may be part of a magnetic lens.

In an instance, the sidewall defines a first section and a second section. The first section may correspond to the frustoconical aperture. The second section can define a second frustoconical aperture that widens at a greater rate than the frustoconical aperture. The second section can be disposed on the first section and meets the second surface.

The sidewalls may be coated with carbon.

A scanning electron microscope including the apparatus of any of the foregoing embodiments.

In a second embodiment, an electron beam system is provided. The electron beam system comprises an electron source and an extractor. The electron source includes an electron emitter. The extractor has a first surface and a second surface opposite the first surface. The extractor has a sidewall that defines a frustoconical aperture between the first surface and the second surface. The frustoconical aperture widens from the first surface to the second surface. The sidewall of the frustoconical aperture meets the first surface at a curved edge. The curved edge has a radius from 5 μm to 50 μm. The electron source may be configured to operate in Schottky emission mode. The extractor may be part of a magnetic lens.

In a third embodiment, an extractor system is provided. The extractor system comprises a first electrode, a second electrode, and a third electrode. The first electrode has a first surface, a second surface, and a sidewall that defines a cylindrical aperture between the first surface and the second surface. The second electrode is disposed adjacent and spaced apart from the first electrode. The second electrode has a second electrode first surface and a second electrode second surface opposite the second electrode first surface. The second electrode has a second electrode sidewall that defines a second electrode frustoconical aperture between the second electrode first surface and the second electrode second surface. The second electrode frustoconical aperture widens from the second electrode first surface to the second electrode second surface. The second electrode sidewall of the second electrode frustoconical aperture meets the second electrode first surface at a curved edge. The third electrode is disposed adjacent and spaced apart from the second electrode. The third electrode has a third electrode first surface and a third electrode second surface opposite the third electrode first surface. The third electrode has a third electrode sidewall that defines a third electrode frustoconical aperture between the third electrode first surface and the third electrode second surface. The third electrode frustoconical aperture widens from the third electrode first surface to the third electrode second surface. The third electrode sidewall of the third electrode frustoconical aperture meets the third electrode first surface at a second curved edge.

The first electrode and the third electrode may both be biased at a first voltage. The second electrode may be biased at a second voltage different from the first voltage.

The cylindrical aperture of the first electrode can have a first diameter. The second electrode frustoconical aperture of the second electrode may have a second diameter at the second electrode first surface and a third diameter at the second electrode second surface. The third electrode frustoconical aperture of the third electrode may have a fourth diameter at the third electrode first surface and a fifth diameter at the third electrode second surface. The first diameter and the second diameter may be equal and the third diameter and the fourth diameter may be equal.

The extraction system may further comprise a suppressor disposed adjacent and spaced apart from the first electrode opposite the second electrode.

A scanning electron microscope including the extraction system of any of the previous embodiments of the extractor system.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein improve the performance of an electron optical system, such as an electron source, by optimizing the design of an extractor to minimize the generation of secondary electrons that interact with and degrade the primary electron beam. The embodiments disclosed herein also can enable the use of a strong magnetic lens to focus a primary beam of electrons without degradation by a surrounding cloud of secondary electrons. As disclosed herein, the extractor design can be optimized to provide these benefits.

Figure 1:
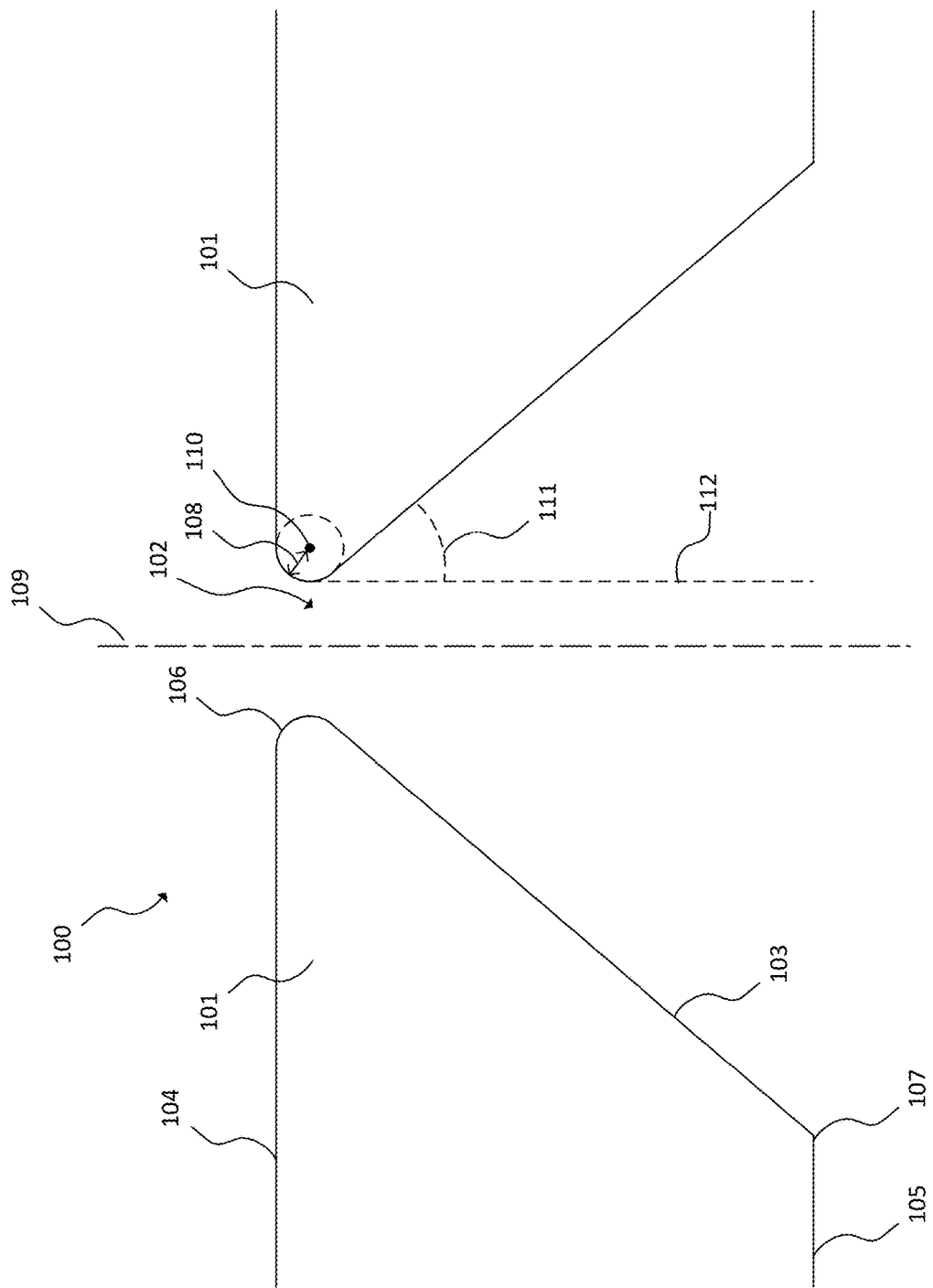
FIG. 1 is a cross-sectional view of an extractor electrode in accordance with an embodiment of the present disclosure.

FIG. 1 is a cross-sectional view of an extractor electrode (extractor) 100. The extractor 100 has a first surface 104 and a second surface 105 opposite the first surface 104. The extractor 100 also has a sidewall 103 that defines a frustoconical aperture 102 between the first surface 104 and the second surface 105. The frustoconical aperture 102 widens from the first surface 104 to the second surface 105. The frustoconical aperture 102 may be centrally disposed in the extractor 100, such as being centrally-located in the first surface 104.

Electrons can pass through the frustoconical aperture 102 as illustrated by the dashed line 109. Some electrons will be blocked by the first surface 104. Other electrons may have curved trajectories that angle toward the sidewall 103 as these electrons enter the frustoconical aperture 102. However, the sidewall 103 is angled, which reduces or prevents the electrons from impacting the sidewall 103. Thus, the extractor 100 minimizes the surface area of the sidewall 103 that is illuminated by the electron beam. This, in turn, minimizes generation of secondary electrons.

The sidewall 103 of the frustoconical aperture 102 meets the first surface 104 at a curved edge 106. The sidewall 103 of the frustoconical aperture 102 meets the second surface 105, such as at an angled edge 107.

The design of the curved edge 106 can eliminate sharp corners, which reduces high voltage arcing or discharges. The curved edge 106 has a radius 108 relative to a center point 110 within the extractor 100. The radius 108 may be selected to minimize generation of secondary electrons. A smaller radius 108 reduces an impact area for the primary electron beam, which minimizes generation of secondary electrons. However, a smaller radius 108 may be challenging to machine and can lead to high voltage arcing or discharge. For example, the radius 108 may be from 5 μm to 50 μm, including all values to the 0.5 μm and ranges between.

In an alternate embodiment, the curved edge 106 may instead be a beveled edge.

In an instance, the frustoconical aperture 102 has a circular cross-section. However, the aperture may have other cross-sectional shapes.

The sidewall 103 extends at an angle 111 from a line 112 through the frustoconical aperture 102. The line 112 may be parallel to a line passing through a center of the frustoconical aperture 102. The angle 111 may be selected to minimize generation of secondary electrons. For example, the angle 111 may be from 5° to 75°, including all values to the 0.5° and ranges between. It may be possible to machine larger angles.

The frustoconical aperture 102 can have a diameter from 100 μm to 500 μm near the first surface 104, including all values to the 0.5 μm and ranges between. The frustoconical aperture 102 has a larger diameter at the second surface 105 than at the first surface 104. The frustoconical aperture 102 can have a depth between the first surface 104 and the second surface 105 from 0.3 mm to 2.0 mm, including all values to the 0.1 mm and ranges between. Such diameters and depths can minimize generation of secondary electrons and can compensate for possible misalignment with an emitter relative to the frustoconical aperture 102. It may be possible to machine smaller or larger diameters or depths that provide similar benefits.

The extractor 100 can be positioned downstream from the emitter with respect to a direction of an electron beam (e.g., the primary electron beam). The extractor may be configured to generate an electrostatic field at the emitter thereby causing electron emission and acceleration.

The extractor 100 may be fabricated of non-magnetic conductive materials, such as those compatible with ultra-high vacuum (UHV) conditions (e.g., materials that provide low outgassing). The materials for the extractor 100 may be refractory materials with a high melting point. The materials for the extractor 100 also may need to be suitable for precision machining. For example, the extractor 100 may be fabricated of molybdenum, titanium, platinum, graphite, other carbon-based materials, stainless steel (such as Nitronic 60, which can be Cr 17, Mn 8, Ni 8.5, Si 4, N 0.13, C 0.10, Fe bal.), or other materials. The materials may be selected based on low secondary emission coefficient in the extractor 100 voltage range. A surface coating may reduce fabrication costs and can reduce secondary electron emission at typical extractor voltages. The surface coating can be, for example, a carbon film over a titanium base or a platinum film over a stainless steel base.

The extractor 100 of FIG. 1 can be used in a scanning electron microscope or other devices that use electron beams.

Figure 2:
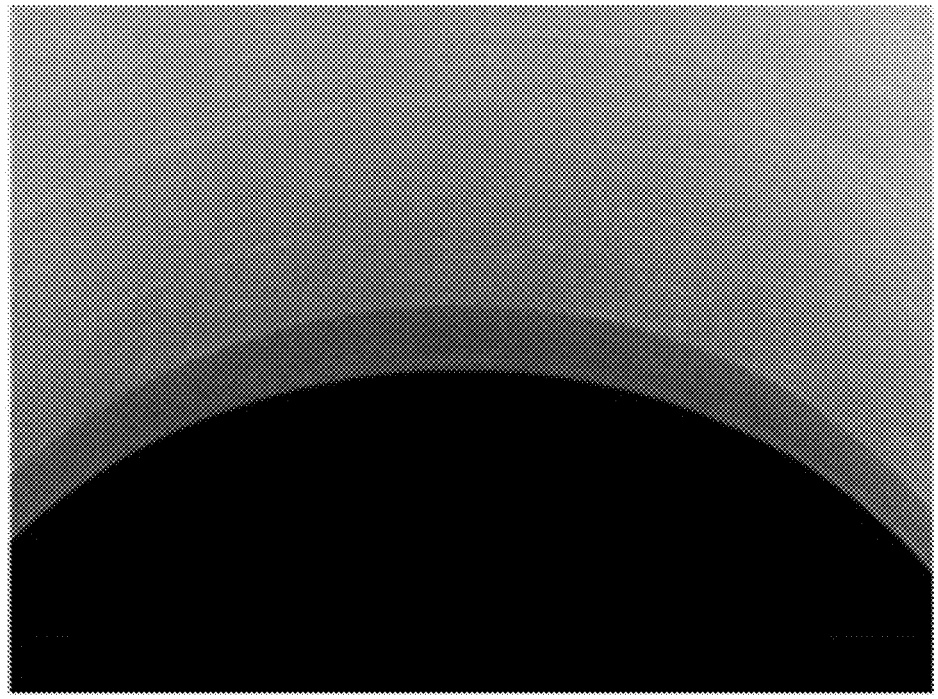
FIG. 2 is a scanning electron microscope image of a top surface of an exemplary extractor electrode.
Figure 3:
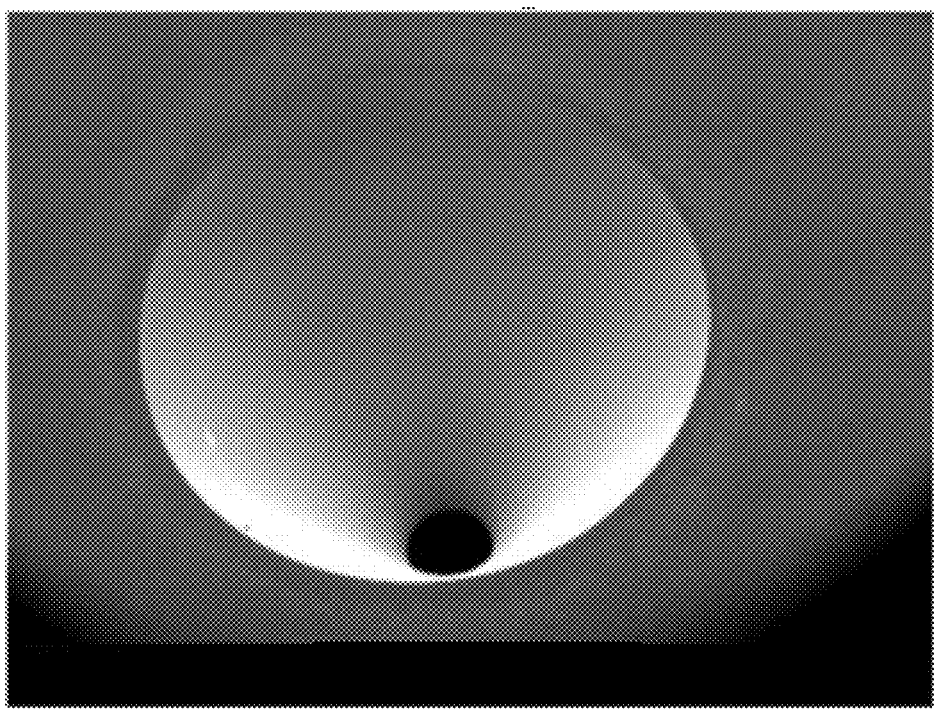
FIG. 3 is a scanning electron microscope image of a bottom surface of the exemplary extractor electrode of FIG. 2.

FIG. 2 is a scanning electron microscope image of a top surface and FIG. 3 is a scanning electron microscope image of a bottom surface of an exemplary extractor. The surface finish may be in a range from 0.1 μm to 0.5 μm Ra, wherein Ra is an arithmetic mean of surface roughness. Other surface finish properties may be used. The lower limit of Ra may be set by cost and time to machine while the upper limit of Ra may be set by risk of high-voltage discharges or arcing. Thus, other Ra values are possible.

Figure 4:
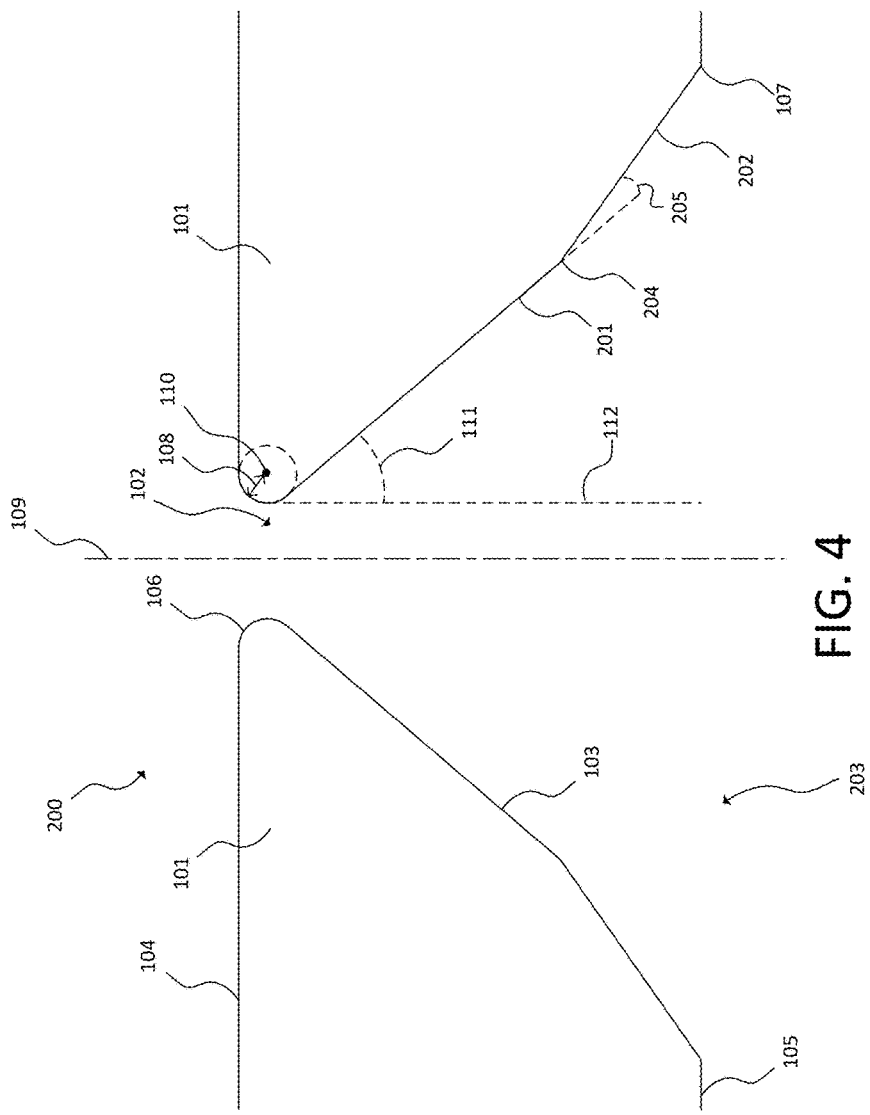
FIG. 4 is a cross-sectional view of a second embodiment of an extractor electrode in accordance with an embodiment of the present disclosure.

FIG. 4 is a cross-sectional view of a second embodiment of an extractor 200. The extractor 200 includes many of the features of the extractor 100, but the sidewall 103 is divided into a first section 201 and a second section 202 that meet at an angle 204. The first section 201 can correspond to the frustoconical aperture 102 from FIG. 1. The second section 202 of the sidewall 103 can form a second frustoconical aperture 203 that widens at a greater rate than the frustoconical aperture 102 as a distance from the first surface 104 increases. In this embodiment, the first section 201 meets the curved edge 106 and the second section 202 meets the second surface 105.

The second section 202 may be angled from the first section 201 by an angle 205 from 15° to 45°. This can account for possible misalignments of the extractor 200 relative to an emitter and may prevent excessive electrostatic field leakage caused by a large angle between the first section 201 and the second section 202. A larger or smaller angle 205 between the first section 201 and the second section 202 may be possible.

The embodiment of FIG. 4 further reduces the possibility of secondary electron generation because the sidewall 103 is angled even farther away from the path of the electron beam, such as that illustrated by the dashed line 109, in the second section 202.

Additional sections besides the first section 201 and second section 202 are possible. These additional sections also may meet at an angle.

While shown meeting at an angle 204, two of the sections in the extractor 200 may meet at a rounded edge.

The extractor 200 of FIG. 4 can be used in a scanning electron microscope or other devices that use electron beams.

Figure 5:
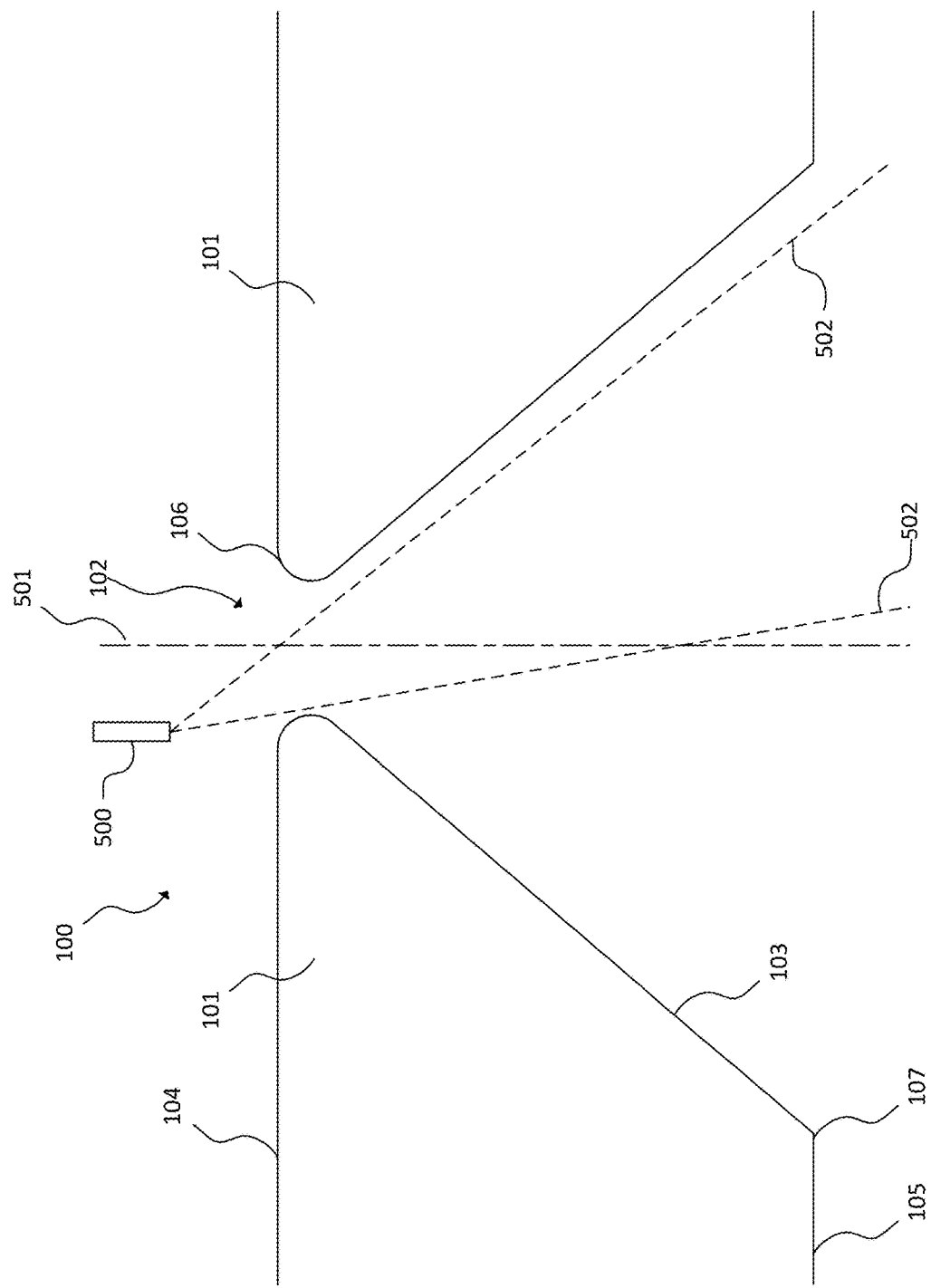
FIG. 5 is a view of the extractor electrode of FIG. 1 during an embodiment of operation.

FIG. 5 is a view of the extractor 100 of FIG. 1 during an embodiment of operation. The tip 500 is misaligned with respect to the center of the frustoconical aperture 102 (represented by the line 501). However, electrons extracted from the tip 500 (represented by the lines 502) can still pass through the extractor 100 with minimized generation of secondary electrons. The benefit of FIG. 5 can be applicable to the extractor 200 of FIG. 4 as well.

Figure 6:
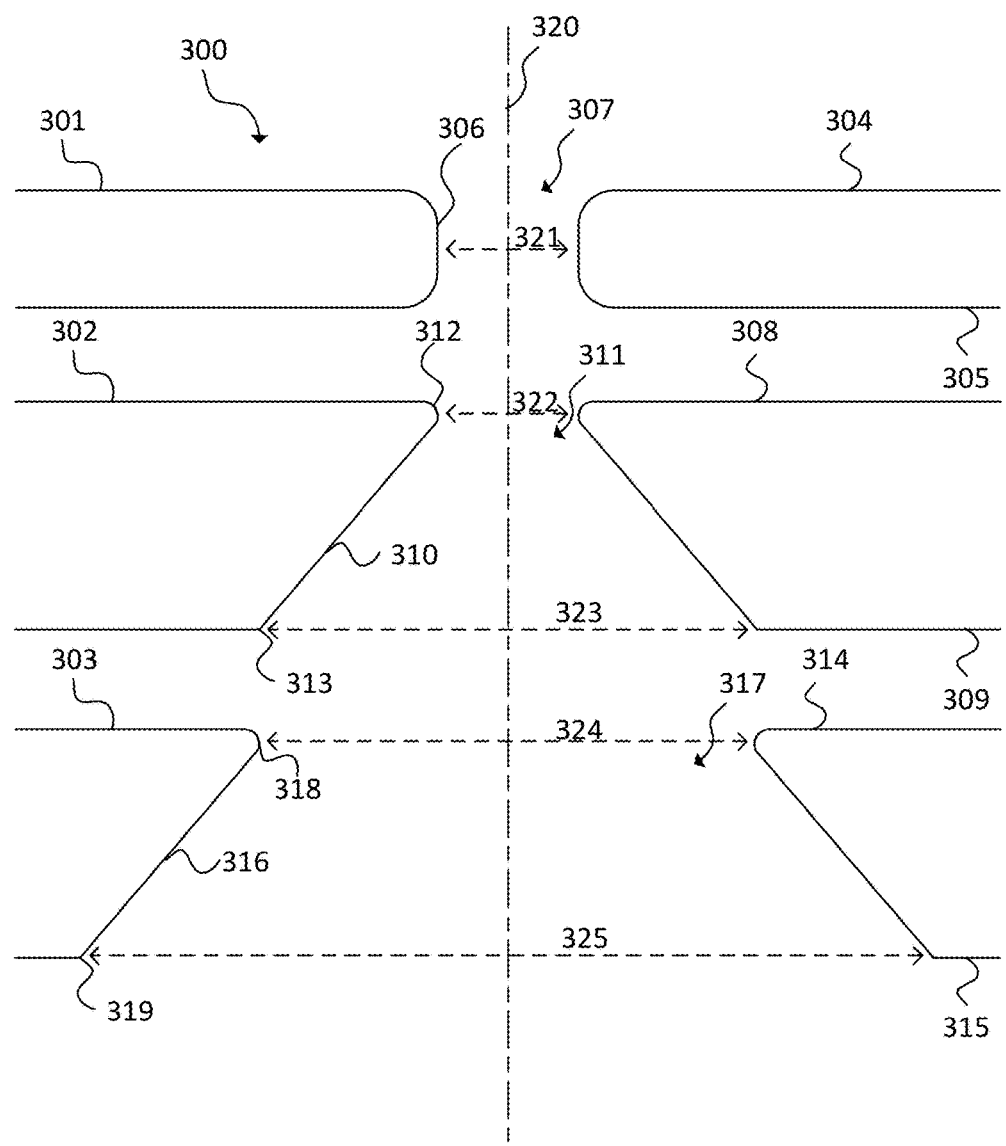
FIG. 6 is a cross-sectional view of a third embodiment of an extractor system in accordance with an embodiment of the present disclosure.

FIG. 6 is a cross-sectional view of a third embodiment of an extractor system 300 with a first electrode 301, second electrode 302, and third electrode 303. The second electrode 302 and third electrode 303 may correspond to the extractor 100 or extractor 200 of FIG. 1 or 4. As seen in FIG. 6, an electron beam passes through the first electrode 301, second electrode 302, and third electrode 303, such as along the dashed line 320.

The first electrode 301 has a first surface 304 and opposite second surface 305. The first electrode 301 also has a sidewall 306 that defines a cylindrical aperture 307 between the first surface 304 and the second surface 305. The cylindrical aperture 307 may have other shapes, such as frustoconical. FIG. 6 shows curved edges on the first electrode 301, but the edges also may be beveled.

The second electrode 302 is disposed adjacent and spaced apart from the first electrode 301. The second electrode 302 has a second electrode first surface 308 opposite second electrode second surface 309. The second electrode 302 also has a second electrode sidewall 310 that defines a second electrode frustoconical aperture 311 between the second electrode first surface 308 and the second electrode second surface 309. The second electrode frustoconical aperture 311 widens from the second electrode first surface 308 to the second electrode second surface 309.

The second electrode sidewall 310 of the second electrode frustoconical aperture 311 can meet the second electrode first surface 308 at a curved edge 312 and can meet the second electrode second surface 309 at an angled edge 313. The second electrode sidewall 310 also can meet the second electrode second surface 309 at a curved edge.

The third electrode 303 is disposed adjacent and spaced apart from the second electrode 302. The third electrode 303 has a third electrode first surface 314 and a third electrode second surface 315 opposite the third electrode first surface 314. The third electrode 303 also has a third electrode sidewall 316 that defines a third electrode frustoconical aperture 317 between the third electrode first surface 314 and the third electrode second surface 315. The third electrode frustoconical aperture 317 widens from the third electrode first surface 314 to the third electrode second surface 315.

The third electrode sidewall 316 of the third electrode frustoconical aperture 317 can meet the third electrode first surface 314 at a second curved edge 318 and can meet the third electrode second surface 315 at a second angled edge 319. The third electrode sidewall 316 also can meet the third electrode second surface 315 at a curved edge.

In an instance, the first electrode 301 and the third electrode 303 are both biased at a first voltage (e.g., $V_{ext}$).

The second electrode 302 is biased at a second voltage (e.g., $V_{ext} \pm \Delta V$) different from the first voltage.

During operation, secondary electrons may be rejected back to the sidewalls by a negative field with a $\Delta V$ of approximately negative tens to low hundreds of volts. If $\Delta V$ is positive tens to low hundreds of volts, then the secondary electrons may be extracted or collected by the second electrode 302. As a result, few or no secondary electrons may exit the extractor system 300 to enter an accelerator region located downstream of the extractor system 300 with respect to a direction of the electron beam.

In an embodiment, the cylindrical aperture 307 of the first electrode 301 has a first diameter 321. This may be at the narrowest point in the cylindrical aperture 307. The second electrode frustoconical aperture 311 of the second electrode 302 can have a second diameter 322 at the second electrode first surface 308 and a third diameter 323 at the second electrode second surface 309, which may be at the narrowest and widest points of the second electrode frustoconical aperture 311, respectively. The third electrode frustoconical aperture 317 of the third electrode 303 can have a fourth diameter 324 at the third electrode first surface and a fifth diameter 325 at the third electrode second surface 315, which may be at the narrowest and widest points of the third electrode frustoconical aperture 317, respectively. The first diameter 321 and the second diameter 322 may be equal. The third diameter 323 and the fourth diameter 324 may be equal. The fifth diameter 325 may be larger than any of the other diameters. While drawn as equal, other diameters are possible.

The first diameter 321 may be from 100 µm to 500 µm. The second diameter 322 may be from 200 µm to 600 µm. The fourth diameter 324 may be from 300 µm to 800 µm. The second electrode frustoconical aperture 311 and the third electrode frustoconical aperture 317 may be angled from 15° to 60° and 15° to 60° relative to the dashed line 320 (which may be parallel to a line through the center of the various apertures), respectively. The depth of the second electrode frustoconical aperture 311 and third electrode frustoconical aperture 317 may be from 0.3 mm to 2.0 mm, including all values to the 0.1 mm and ranges between. The dimensions and angles in the second electrode frustoconical aperture 311 and the third electrode frustoconical aperture 317 may be selected such that the primary beam electrons emitted from the source tip do not bombard their aperture surfaces, even if the tip is misaligned. The primary beam electrons may bombard the aperture surface of the first electrode 301 and generate secondary electrons. These secondary electrons can be rejected or extracted by the second electrode 302. Other dimensions for the second electrode frustoconical aperture 311 and the third electrode frustoconical aperture 317 are possible because the potential differences between the electrodes are as low as around a hundred Volts. For example, the dimensions may vary by a value from 10 µm to 50 µm.

The radii for the curved edge 312 and second curved edge 318 may be from 10 µm to 50 µm. These dimensions may be possible because the fields at the second electrode 302 and third electrode 303 can be relatively small. There may be less concern with minimizing the surface area exposed to the electron beam in the second electrode 302 and third electrode 303 because the extractor system 300 may rely on rejecting or trapping secondary electrons rather than minimizing generation of secondary electrons. The radii for curved edges in the first electrode also may be from 10 µm to 50 µm. Other radii are possible.

A suppressor can be disposed adjacent and spaced apart from the first electrode 301 opposite the second electrode 302.

The extractor system 305 of FIG. 6 can be used in a scanning electron microscope or other devices that use electron beams. The extractor system 305 can be retrofitted into existing systems without redesigning the electron emission system.

The impact of the secondary electrodes can be further minimized using the embodiments disclosed in FIGS. 1-5. For example, a distance between the extractor or extractor system and a subsequent electrode (e.g., an electrode downstream of the extractor) can be minimized. Thus, the travel distance of the primary electron beam to the subsequent electrode is shorter, and the primary electron beam travels faster due to the higher acceleration between the electrodes. The travel time of the primary electron beam is reduced, along with the interaction time with the secondary electrons. However, the shorter distance between the electrodes can reduce the maximum practical voltage difference between the electrodes, and, therefore, the maximum usable voltage of the electron source. In addition, the total range of beam current may be reduced. Minimizing the distance may be applicable for various applications.

The extractor or extractor system may be coated with a material with low secondary electron yield, such as carbon, to further minimize generation of secondary electrons.

Embodiments of the extractor disclosed herein can be manufactured by micromachining (e.g., drilling), though other techniques are possible.

Embodiments disclosed herein can be used in an electron source with a magnetic lens, where the interaction time between the primary and secondary electrons is greatest. For example, the electron source may include a magnetic immersion lens.

Embodiments disclosed herein may be implemented as part of an electron source. The electron source can operate in the Schottky emission mode, with a combination of high temperature and high electrostatic field at the electron emitter. The extractor or extractor system can generate the electrostatic field at the emitter, causing both electron emission from the emitter and acceleration of the electron beam away from the emitter. A magnetic lens can focus the primary electron beam as it travels through the electron source. With the optimized design of the extractor or extractor system, in particular the sidewalls, secondary electron generation is minimized and the primary beam is undisturbed. This can enable a high-performance electron source for electron beam inspection and review. Such an electron source may need to deliver an electron beam into a very small spot size (e.g., as low as 1-2 nm) over a wide range of beam energy and current. Unless secondary electron generation is minimized, difficult tradeoffs of beam spot size, beam energy range, or beam current range may need to be accepted.

Figure 7:
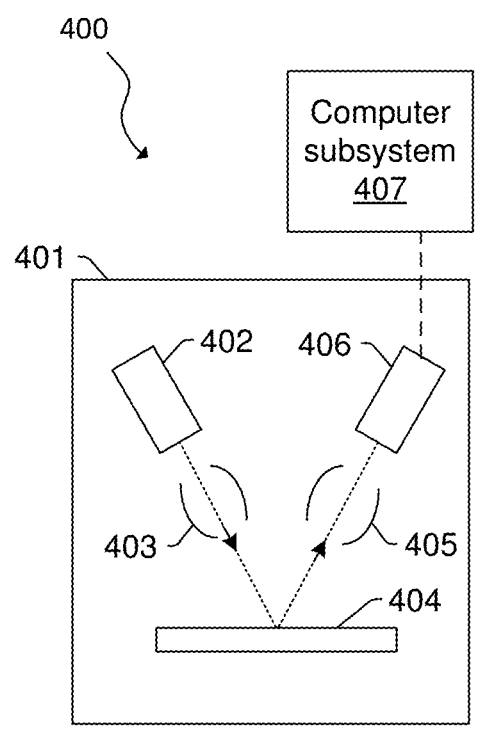
FIG. 7 is an embodiment of a system in accordance with the present disclosure.

The embodiments described herein may include or be performed in a system, such as the system 400 of FIG. 7. The system 400 includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source 402, which can include or be coupled with an extractor or extractor system as disclosed herein. In one such embodiment shown in FIG. 7, the output acquisition subsystem includes electron optical column 401, which is coupled to computer subsystem 407.

As also shown in FIG. 7, the electron optical column 401 includes electron beam source 402 configured to generate electrons that are focused to wafer 404 by one or more elements 403. The electron beam source 402 may include an emitter and one or more elements 403 may include, for example, a gun lens, an anode, a beam limiting aperture, a gate valve, a beam current selection aperture, an objective lens, and/or a scanning subsystem. The electron column 401 may include any other suitable elements known in the art. While only one electron beam source 402 is illustrated, the system 400 may include multiple electron beam sources 402.

Electrons returned from the wafer 404 (e.g., secondary electrons) may be focused by one or more elements 405 to detector 406. One or more elements 405 may include, for example, a scanning subsystem, which may be the same scanning subsystem included in element(s) 403. The electron column 401 may include any other suitable elements known in the art.

Although the electron column 401 is shown in FIG. 7 as being configured such that the electrons are directed to the wafer 404 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

Computer subsystem 407 may be in electronic communication with the detector 406. The detector 406 may detect electrons returned from the surface of the wafer 404 thereby forming electron beam images of the wafer 404. The electron beam images may include any suitable electron beam images. Computer subsystem 407 may be configured to perform other functions or additional steps using the output of the detector 406 and/or the electron beam images.

It is noted that FIG. 7 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system).

In one embodiment, the system 400 is an inspection system. For example, the electron beam output acquisition subsystems described herein may be configured as inspection systems. In another embodiment, the system 400 is a defect review system. For example, the electron beam output acquisition subsystems described herein may be configured as defect review systems. In a further embodiment, the system 400 is a metrology system. For example, the electron beam output acquisition subsystems described herein may be configured as metrology systems. In particular, the embodiments of the system 400 described herein and shown in FIG. 7 may be modified in one or more parameters to provide different imaging capability depending on the application for which they will be used. In one such example, the system 400 shown in FIG. 7 may be configured to have a higher resolution if it is to be used for defect review or metrology rather than for inspection. In other words, the embodiment of the system 400 shown in FIG. 7 describes some general and various configurations for a system 400 that can be tailored in a number of manners to produce output acquisition subsystems having different imaging capabilities that are more or less suitable for different applications.

In particular, the embodiments described herein may be installed on a computer node or computer cluster that is a component of or coupled to an output acquisition subsystem such as an electron beam inspector or defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 400 shown in FIG. 7 can be modified as described above based on the specimen for which it will generate output.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
an extractor having a first surface and a second surface opposite the first surface, wherein the extractor has a sidewall that defines a frustoconical aperture between the first surface and the second surface, wherein the frustoconical aperture widens from the first surface to the second surface, wherein the sidewall of the frustoconical aperture meets the first surface at a curved edge, and wherein the curved edge has a radius from 5 µm to 50 µm.

2. The apparatus of claim 1, further comprising an emitter, wherein the extractor is positioned downstream of the emitter with respect to a direction of an electron beam.

3. The apparatus of claim 2, wherein the extractor is configured to generate an electrostatic field at the emitter thereby causing electron emission and acceleration.

4. The apparatus of claim 1, wherein the aperture is central to the first surface of the extractor.

5. The apparatus of claim 1, wherein the sidewall meets the second surface at an angled edge.

6. The apparatus of claim 1, wherein the sidewall is angled relative to a center of the frustoconical aperture from 5° to 75°.

7. The apparatus of claim 1, wherein the frustoconical aperture has a diameter from 100 µm to 500 µm.

8. The apparatus of claim 1, wherein the frustoconical aperture has a depth from 0.3 mm to 2.0 mm.

9. The apparatus of claim 1, wherein the extractor is part of a magnetic lens.

10. The apparatus of claim 1, wherein the sidewall defines a first section and a second section, wherein the first section corresponds to the frustoconical aperture, wherein the second section defines a second frustoconical aperture that widens at a greater rate than the frustoconical aperture and wherein the second section is disposed on the first section and meets the second surface.

11. The apparatus of claim 1, wherein the sidewalls are coated with carbon.

12. A scanning electron microscope including the apparatus of claim 1.

13. An electron beam system comprising:
an electron source that includes an electron emitter; and
an extractor having a first surface and a second surface opposite the first surface, wherein the extractor has a sidewall that defines a frustoconical aperture between the first surface and the second surface, wherein the frustoconical aperture widens from the first surface to the second surface, wherein the sidewall of the frustoconical aperture meets the first surface at a curved edge, and wherein the curved edge has a radius from 5 μm to 50 μm.

14. The electron beam system of claim 13, wherein the electron source is configured to operate in Schottky emission mode.

15. The electron beam system of claim 13, wherein the extractor is part of a magnetic lens.

16. An extraction system comprising:
a first electrode having a first surface, a second surface, and a sidewall that defines a cylindrical aperture between the first surface and the second surface;
a second electrode disposed adjacent and spaced apart from the first electrode, wherein the second electrode has a second electrode first surface and a second electrode second surface opposite the second electrode first surface, wherein the second electrode has a second electrode sidewall that defines a second electrode frustoconical aperture between the second electrode first surface and the second electrode second surface, wherein the second electrode frustoconical aperture widens from the second electrode first surface to the second electrode second surface, and wherein the second electrode sidewall of the second electrode frustoconical aperture meets the second electrode first surface at a curved edge; and
a third electrode disposed adjacent and spaced apart from the second electrode, wherein the third electrode has a third electrode first surface and a third electrode second surface opposite the third electrode first surface, wherein the third electrode has a third electrode sidewall that defines a third electrode frustoconical aperture between the third electrode first surface and the third electrode second surface, wherein the third electrode frustoconical aperture widens from the third electrode first surface to the third electrode second surface, and wherein the third electrode sidewall of the third electrode frustoconical aperture meets the third electrode first surface at a second curved edge.

17. The extraction system of claim 16, wherein the first electrode and the third electrode are both biased at a first voltage, and wherein the second electrode is biased at a second voltage different from the first voltage.

18. The extraction system of claim 16, wherein the cylindrical aperture of the first electrode has a first diameter, wherein the second electrode frustoconical aperture of the second electrode has a second diameter at the second electrode first surface and a third diameter at the second electrode second surface, wherein the third electrode frustoconical aperture of the third electrode has a fourth diameter at the third electrode first surface and a fifth diameter at the third electrode second surface, wherein the first diameter and the second diameter are equal, and wherein the third diameter and the fourth diameter are equal.

19. The extraction system of claim 16, further comprising a suppressor disposed adjacent and spaced apart from the first electrode opposite the second electrode.

20. A scanning electron microscope including the extraction system of claim 16.

* * * * *